United States Patent
Tuan

(10) Patent No.: US 10,777,603 B1
(45) Date of Patent: Sep. 15, 2020

(54) OPTICAL SENSOR

(71) Applicant: INT TECH CO., LTD., Hsinchu County (TW)

(72) Inventor: Fu-Yuan Tuan, New Taipei (TW)

(73) Assignee: INT TECH CO., LTD., Hsinchu (TW)

(*) Notice: Subject to any disclaimer, the term of this patent is extended or adjusted under 35 U.S.C. 154(b) by 0 days.

(21) Appl. No.: 16/428,153

(22) Filed: May 31, 2019

(51) Int. Cl.
  *H01L 27/32* (2006.01)
  *H01L 27/146* (2006.01)
  *G06F 3/042* (2006.01)

(52) U.S. Cl.
  CPC ...... *H01L 27/14678* (2013.01); *G06F 3/0421* (2013.01); *H01L 27/1462* (2013.01); *H01L 27/14603* (2013.01); *H01L 27/14627* (2013.01); *H01L 27/14629* (2013.01); *H01L 27/14636* (2013.01); *H01L 27/14643* (2013.01); *H01L 27/14685* (2013.01); *H01L 27/14689* (2013.01)

(58) Field of Classification Search
  CPC .............. H01L 27/323; H01L 27/3227; H01L 27/14607; H01L 27/1461; H01L 25/167
  See application file for complete search history.

(56) References Cited

U.S. PATENT DOCUMENTS

2019/0013368 A1* 1/2019 Chung ................ H01L 27/3234

OTHER PUBLICATIONS

Mohamed M. Hilali, Sayan Saha, Emmanuel Onyegam, Rajesh Rao, Leo Mathew, and Sanjay K. Banerjee, "Light trapping in ultrathin 25 μm exfoliated Si solar cells," Appl. Opt. 53, 6140-6147 (2014).
Isozaki, A & Kuwana, Kenta & Tomimatsu, Yutaka & Itoh, T. (2011). Photodiode with micro texture for improving sensitivity at large angle of incidence for particle sensors. 2050-2053. 10.1109/TRANSDUCERS.2011.5969219.
Riazimehr, Sarah & Kataria, Satender & Gonzalez-Medina, Jose & Shaygan, Mehrdad & Suckow, Stephan & Ruiz, Francisco & Engström, Olof & Godoy, A & Lemme, Max. (2018). High Responsivity and Quantum Efficiency of Graphene / Silicon Photodiodes Achieved by Interdigitating Schottky and Gated Regions.
XB06 Photo Diode Evaluation Chips, Marketing & Sales Headquarters, X-FAB Semiconductor Foundries AG, Haarbergstr. 67, 99097 Erfurt, Germany.
Matsuki, Fumirou et al. "Integrated Ambient Light Sensor with an LTPS Noise-Robust Circuit and a-Si Photodiodes for AMLCDs." IEICE Transactions 93-C (2010): 1583-1589. Figure 2 Structure of Vertical a-Si Schottky photodiode.

(Continued)

*Primary Examiner* — Jae Lee
(74) *Attorney, Agent, or Firm* — WPAT, P.C., Intellectual Property Attorneys; Anthony King

(57) ABSTRACT

An optical sensor is provided. The optical sensor includes a substrate, a transistor, a first electrode, a photodiode, a second electrode and an anti-reflective layer. The transistor is disposed over the substrate. The first electrode is disposed over the substrate and electrically connected to the transistor. The second electrode is disposed over the first electrode, and the photodiode is disposed between the first electrode and the second electrode. The anti-reflective layer is disposed over the second electrode and a first U-shaped portion lining the second electrode.

18 Claims, 14 Drawing Sheets

(56) References Cited

OTHER PUBLICATIONS

Guissi, Sofiane"https://www.coventor.com/blog/cmos-image-sensors-cis-past-present-future/", Wednesday, Jun. 14, 2017, Posted in: Coventor Blog by Marketing | Comments Off on CMOS Image Sensors (CIS): Past, Present & Future.

"http://hamamatsu.magnet.fsu.edu/articles/microlensarray.html", Mortimer Abramowitz—Olympus America, Inc., Two Corporate Center Drive., Melville, New York, 11747., Michael W. Davidson—National High Magnetic Field Laboratory, 1800 East Paul Dirac Dr., The Florida State University, Tallahassee, Florida, 32310.

"https://skullsinthestars.com/2007/08/31/optics-basics-the-three-major-branches-of-optical-science/", Posted on Aug. 31, 2007 by skullsinthestars.

"https://www.strollswithmydog.com/perfect-color-filter-array/", The Perfect Color Filter Array, Jan. 20, 2018.

Hee Joon Kim, Ho Kyung Kim, Gyuseong Cho, Joonhoo Choi,Construction and characterization of an amorphous silicon flat-panel detector based on ion-shower doping process,Nuclear Instruments and Methods in Physics Research Section A: Accelerators, Spectrometers, Detectors and Associated Equipment,vol. 505, Issues 1-2, 2003, pp. 155-158, ISSN 0168-9002.

"http://www.pitotech.com.tw/contents/zh-tw/p13450_8_3_%E5%BE%AE%E9%80%8F%E9%8F%A1%EF%BC%88microlens%EF%BC%89%E5%85%89%E5%AD%B8%E6%A8%A1%E6%93%AC%E4%B8%8A%E6%A9%9F%E5%AF%A6%E5%81%9A(%E6%96%B0%E7%AB%B9).html", PITOTECH CO., LTD., Taiwan.

English translation of "http://www.pitotech.com.tw/contents/zh-tw/p13450_8_3_%E5%BE%AE%E9%80%8F%E9%8F%A1%EF%BC%88microlens%EF%BC%89%E5%85%89%E5%AD%B8%E6%A8%A1%E6%93%AC%E4%B8%8A%E6%A9%9F%E5%AF%A6%E5%81%9A(%E6%96%B0%E7%AB%B9).html", Pitotech Co., Ltd., Taiwan.

"https://www.slideshare.net/JaydeepBhayani773/image-sensor-ppt", Published on Mar. 11, 2015, on Slide Share website published in: Engineering.

\* cited by examiner

OPTICAL SENSOR

TECHNICAL FIELD

The present disclosure is related to a semiconductor structure, and more particularly to an optical sensor structure.

BACKGROUND

A touchscreen is an input and output device usually layered on the top of an electronic visual display. A user can enter information or control an information processing system by touching the screen with one or more fingers, a stylus or a special pen to substitute for (or use instead of) a mouse or a remote control. The touchscreen enables the user to interact directly with what is displayed, rather than using a mouse, a keyboard, or other such device (other than a stylus, which is optional for most modern touchscreens). With easily-marketed features of portability and ease of use and control, which are especially important for older users and children, the touchscreen provides high convenience and has become a main product in the consumer display market.

SUMMARY

One aspect of the present disclosure provides an optical sensor. The optical sensor includes a substrate, a transistor, a first electrode, a photodiode, a second electrode and an anti-reflective layer. The transistor is disposed over the substrate. The first electrode is disposed over the substrate and electrically connected to the transistor. The second electrode is disposed over the first electrode, and the photodiode is disposed between the first electrode and the second electrode. The anti-reflective layer is disposed over the second electrode and includes a first U-shaped portion lining the second electrode.

In an embodiment of the present disclosure, the first U-shaped portion of the anti-reflective layer is conformal to a second U-shaped portion of the second electrode.

In an embodiment of the present disclosure, the photodiode comprises a third U-shaped portion disposed between the second U-shaped portion of the second electrode and a fourth U-shaped portion of the first electrode.

In an embodiment of the present disclosure, the anti-reflective layer further includes a planar portion, extending along an extending direction of the substrate; and a convex portion, connecting the planar portion to the first U-shaped portion, wherein a thickness of the convex portion is greater than a thickness of the planar portion.

In an embodiment of the present disclosure, the convex portion has a configuration of a ring shape from a top view perspective.

In an embodiment of the present disclosure, an outer diameter of the convex portion is greater than 3 microns.

In an embodiment of the present disclosure, an inner diameter of the convex portion is greater than 1 micron and less than 3 microns.

In an embodiment of the present disclosure, the thickness of the convex portion is in a range of 250 to 450 nanometers.

In an embodiment of the present disclosure, the thickness of the planar portion is in a range of 200 to 350 nanometers.

In an embodiment of the present disclosure, the thickness of the convex portion is in a range of 300 to 350 nanometers, and a thickness of the second electrode is in a range of 20 to 80 nanometers.

In an embodiment of the present disclosure, the anti-reflective layer further includes: a second convex portion, disposed at a bottom of the first U-shaped portion and protruding away from the photodiode.

In an embodiment of the present disclosure, the optical sensor further includes a dielectric layer, disposed between the transistor and the first electrode, comprising a through hole.

In an embodiment of the present disclosure, the first electrode lines the through hole, thereby penetrating the dielectric layer to electrically connect to the transistor.

In an embodiment of the present disclosure, the optical sensor further includes a reflective layer, disposed between the dielectric layer and the first electrode, and lining the through hole.

In an embodiment of the present disclosure, a thickness of the reflective layer is in a range of 130 to 180 nanometers, and a thickness of the first electrode is in a range of 10 to 50 nanometers.

In an embodiment of the present disclosure, the optical sensor further includes a connecting line, disposed between the transistor and the first electrode, wherein a bottom of a U-shaped portion of the first electrode is disposed within a top surface of the connecting line.

In an embodiment of the present disclosure, the optical sensor further includes a capacitor, disposed over the substrate and electrically connected to the transistor.

In an embodiment of the present disclosure, the capacitor, the photodiode and the transistor are electrically connected through one connecting line.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
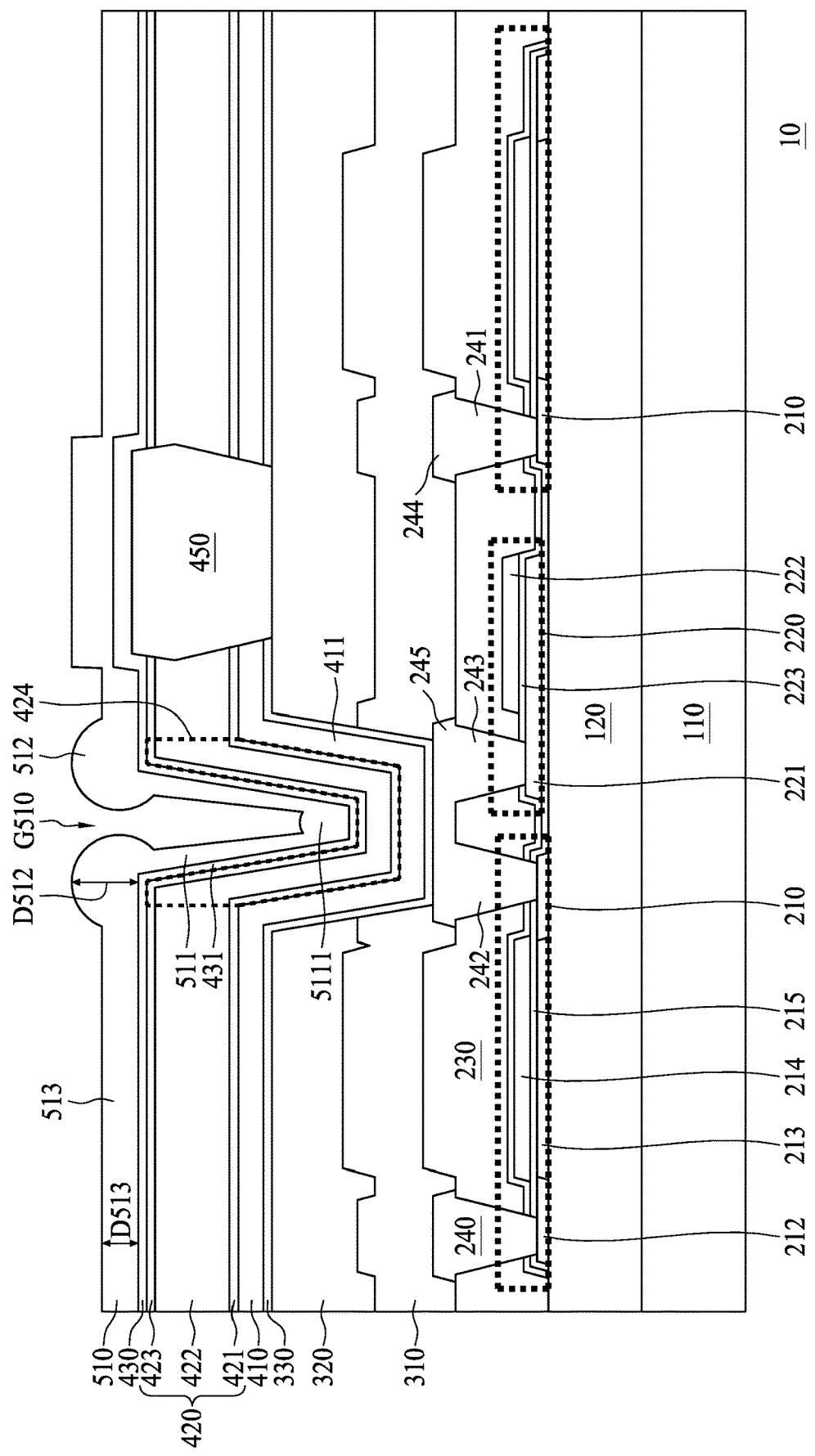
FIG. 1 is a cross-sectional diagram of an optical sensor in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

FIG. 1 shows a cross-sectional diagram of an optical sensor 10 in accordance with some embodiments of the present disclosure. A substrate 110 is provided in the optical sensor 10. The substrate 110 is a transparent substrate, or at least a portion of the substrate 110 is transparent. In some embodiments, the substrate 110 is an inflexible substrate, and a material of the substrate 110 may include glass, quartz, or other suitable material. In some embodiments, the substrate 110 is a flexible substrate, and a material of the substrate 110 may include transparent epoxy resin, polyimide, polyvinyl chloride, methyl methacrylate, or other suitable material. A dielectric layer 120 is optionally disposed over the substrate 110 as shown in FIG. 1. In some embodiments, the dielectric layer 120 may include silicon oxide, silicon nitride, silicon oxynitride, or other suitable material.

One or more circuits are disposed over the substrate 110. The circuit may have several transistors 210 and several capacitors 220 adjacent to the transistors, wherein the transistors 210 and the capacitors 220 are formed over the dielectric layer 120. In some embodiments, the transistors are thin-film transistors (TFT). Each transistor 210 includes source/drain regions 212 (including at least a source region and a drain region), a channel region 213 between the source/drain regions 212, a gate electrode 214 over the channel region 213, and a gate insulator 215 between the channel region 213 and the gate electrode 214. The gate electrode 214 can be made with conductive material such as metal, silicide, or metal alloy. In some embodiments, the gate electrode 214 can be a composite structure including several different layers and the different layers may be distinguishable after applying etchant and observed under microscope. In some embodiments, the gate electrode 214 is formed concurrently with a first metal layer of an inter-layer dielectric structure 230. The inter-layer dielectric structure 230 is disposed over the circuit or the transistors 210. The inter-layer dielectric structure 230 may include several layers of metal wiring and dielectric material for electrical connection and isolation. The channel region 213 of the transistor 210 may be made with semiconductive material such as silicon, or another element selected from group IV, III and V.

In some embodiments, the gate insulator 215 covers the channel region 213 and the source/drain regions 212 of the transistor 210, and the gate insulator 215 is disposed between the adjacent capacitor 220 and the dielectric layer 120. In some embodiments, the gate insulator 215 is formed after formation of the source/drain regions 212 and the channel region 213 over the dielectric layer 120. The source/drain regions 212 are disposed on opposite sides of the channel region 213 to provide carriers. In some embodiments, the capacitors 220 are disposed between the transistors 210. Each capacitor 220 includes a bottom electrode 221, a top electrode 222, and an insulating layer 223 between the top electrode 222 and the bottom electrode 221. In some embodiments, the bottom electrode 221 is formed concurrently with a first metal layer of the inter-layer dielectric structure 230 over the dielectric layer 120. In some embodiments, the insulating layer 223 is formed over the transistors 210 after formation of the first metal layer. In some embodiments, the insulating layer 223 is disposed on and conformal to the bottom electrode 221, and the insulating layer 223 is disposed on and conformal to the transistors 210. The top electrode 222 is disposed over the insulating layer 223 in the inter-layer dielectric structure 230. The top electrode 222 may include titanium, aluminum, copper, titanium nitride, a combination thereof, or other suitable material. In some embodiments, the top electrode 222 is formed concurrently with a second metal layer of the inter-layer dielectric structure 230. In some embodiments, the top electrode 222 and the second metal layer are formed after formation of the insulating layer 223.

A connecting structure 240 is formed to electrically connect the transistor 210 to the capacitor 220. The connecting structure 240 includes a plurality of connecting vias and a plurality of connecting lines. The connecting vias may connect the source/drain regions 212 of the transistor 210, the gate electrode 214 of the transistor 210, and/or the bottom and/or top electrodes 221 and 222 of the capacitors 220 to the connecting line. The connecting structure 240 may include connecting vias 241, which connect to the drain region 212 of the transistor 210 at one end. The connecting structure 240 may include connecting vias 242, which connect to the source region 212 of the transistor 210 at one end. The connecting structure 240 may include connecting vias 243, which connect to the bottom electrode 221 of the capacitor 220 at one end. The connecting structure 240 may include connecting lines 244, which connect to the connecting vias 241 at one end. The connecting structure 240 may include connecting lines, which connect only to the connecting vias 242 at one end (not shown). The connecting structure 240 may further include connecting lines 245, which connect to the connecting vias 242 and also the connecting vias 243 at one end. In some embodiments, the connecting lines are formed concurrently with one of the metal layers (e.g., a third metal layer) of the inter-layer dielectric structure 230.

A data line (not shown) is disposed over the connecting lines of the connecting structure 240 to electrically connect to the source/drain regions 212. A dielectric layer 310 is disposed over the data line, the inter-layer dielectric structure 230 and the connecting structure 240. In some embodiments, the dielectric layer 310 is formed by a conformal deposition. The dielectric layer 310 can be conformal to a configuration of the underlying structure. A planar layer 320 is disposed over the dielectric layer 310. In some embodiments, the planar layer 320 includes dielectric or insulating materials. In some embodiments, the planar layer 320 is formed by a blanket deposition, wherein a bottom surface of the planar layer 320 is conformal to a configuration of the underlying structure, and a top surface of the planar layer 320 is substantially planar. In some embodiments, the planar layer 320 and the dielectric layer 310 include a through hole (or an opening) over the connecting line 245, wherein the connecting line 245 is exposed through the dielectric layer 310 and the planar layer 320 via the through hole.

In the optical sensor 10, a first electrode 410 is disposed over the planar layer 320 over the substrate 110, wherein a portion of the first electrode 410 has a planar surface corresponding to the planar layer 320, and a portion of the first electrode 410 penetrates through the planar layer 320 and the dielectric layer 310 and electrically connects to the transistor 210. The first electrode 410 includes a U-shaped portion 411 disposed in the through hole from a cross-sectional perspective, and the U-shaped portion 411 of the first electrode 410 is surrounded by the planar layer 320 and the dielectric layer 310. In some embodiments, the U-shaped portion 411 lines the through hole, thereby penetrating the dielectric layer 310 and the planar layer 320 and electrically connecting to the transistor 210. The first electrode 410 electrically connects to the transistor 210 and/or the capacitor 220 through the U-shaped portion 411 and the connecting structure 240 (including the connecting vias 242, 243 and the connecting line 245). In some embodiments, the connecting line 245 is disposed between the transistor 210 and the first electrode 410. In some embodiments, the U-shaped portion 411 of the first electrode 410 electrically connects to the transistor 210 through a conductive material or an electrical component. In some embodiments, a bottom of the U-shaped portion 411 of the first electrode 410 physically contacts the connecting line 245. In some embodiments, the bottom of the U-shaped portion 411 of the first electrode 410 completely overlaps the connecting line 245. In some embodiments, the bottom of the U-shaped portion 411 of the first electrode 410 is disposed within a top surface of the connecting line 245.

In some embodiments, the optical sensor 10 further includes a reflective layer 330 disposed between the planar layer 320 and the first electrode 410, and between the connecting line 245 and the first electrode 410. The reflective layer 330 lines the through hole and is conformal to the through hole and the planar layer 320. The reflective layer 330 includes a U-shaped portion conformal to the U-shaped portion 411 of the first electrode 410. The reflective layer 330 may be made of one or more metal materials. In some embodiments, the reflective layer 330 includes aluminum. In some embodiments, the reflective layer 330 physically contacts the connecting line 245, and the first electrode 410 electrically connects to the transistor 210 and/or the capacitor 220 through the reflective layer 330.

In the optical sensor 10, a photodiode 420 is disposed over and conformal to the first electrode 410, wherein a planar portion of the photodiode 420 is disposed over the planar layer 320 and thus has a planar surface facing the planar layer 320. In addition, a U-shaped portion 424 of the photodiode 420 is also in a U-shaped configuration conformal to the U-shaped portion 411 of the first electrode 410 from a cross-sectional perspective. In some embodiments, the U-shaped portion 424 of the photodiode 420 physically connects to the planar portion of the photodiode 420. The photodiode 420 can be a PIN photo-sensor including an N-type doping layer 421, an intrinsic layer 422, and a P-type doping layer 423 stacked in sequence over the first electrode 410. In some embodiments, the N-type doping layer 421, the intrinsic layer 422, and the P-type doping layer 423 are α-silicon layers. In some embodiments, the U-shaped portion 424 of the photodiode 420 is within (or surrounded by) the planar layer 320. In some embodiments, the U-shaped portion 424 of the photodiode 420 penetrates through the planar layer 320. In some embodiments, a bottom of the photodiode 420 is surrounded by the dielectric layer 310. In some embodiments, each of the N-type doping layer 421, the intrinsic layer 422, and the P-type doping layer 423 includes a U-shaped portion conformal to the U-shaped portion 411 of the first electrode 410. In some embodiments, the U-shaped portions of the N-type doping layer 421, the intrinsic layer 422, and the P-type doping layer 423 together to define the U-shaped portion 424 of the photodiode 420.

In the optical sensor 10, a second electrode 430 is disposed over the photodiode 420. The photodiode 420 is disposed between the first electrode 410 and the second electrode 430. A planar portion of the second electrode 430 is disposed over the planar portion of the photodiode 420 and thus has a planar surface corresponding to the planar layer 320. Further, the second electrode 430 includes a U-shaped portion 431 lining the U-shaped portion 424 of the photodiode 420. In some embodiments, the U-shaped portion 431 of the second electrode 430 is conformal to the U-shaped portion 424 of the photodiode 420. In some embodiments, the U-shaped portion 431 of the second electrode 430 is also conformal to the U-shaped portion 411 of the first electrode 410. In some embodiments, the U-shaped portion 424 of the photodiode 420 is disposed between the U-shaped portion 411 of the first electrode 410 and the U-shaped portion 431 of the second electrode 430.

A pixel-defining layer (PDL) 450 is disposed at the same elevation as the photodiode 420 and separated from the U-shaped portion 424 of the photodiode 420. In some embodiments, the PDL 450 is adjacent to the planar portion of the second electrode 430. In some embodiments, the PDL 450 is configured to separate luminous regions of different pixel units of the optical sensor 10. In some embodiments, the PDL 450 encircles the U-shaped portion 424 of the photodiode 420, the transistor 210 and the capacitor 220 from a top view perspective (not shown; the cross-sectional diagram of FIG. 1 shows only a portion of the PDL 450). In some embodiments, the PDL 450 is covered by the second electrode 430.

An anti-reflective layer 510 is disposed over and conformal to the second electrode 430. In some embodiments, the anti-reflective layer 510 lines the second electrode 430. The anti-reflective layer 510 includes a U-shaped portion 511, a convex portion 512 and a planar portion 513. The U-shaped portion 511 of the anti-reflective layer 510 is conformal to the U-shaped portion 431 of the second electrode 430 in the through hole. In some embodiments, the U-shaped portion 511 of the anti-reflective layer 510 includes a convex portion 5111 at an inner bottom of the U-shaped portion 511, wherein the convex portion 5111 protrudes away from the second electrode 430 and the photodiode 420. The planar portion 513 of the anti-reflective layer 510 is disposed over the planar portion of the second electrode 430, forming a planar surface corresponding to the planar layer 320. In some embodiments, the planar portion 513 extends along an extending direction of the substrate 110. The convex portion 512 of the anti-reflective layer 510 connects the U-shaped portion 511 to the planar portion 513. The convex portion 512 is at a position corresponding to a corner of the second electrode 430 between the planar portion and the U-shaped portion 431 of the second electrode 430. The anti-reflective layer 510 of the present disclosure is made of transparent materials. In some embodiments, the anti-reflective layer 510 includes silicon oxynitride. In some embodiments, a thickness D512 of the convex portion 512 is greater than a thickness D513 of the planar portion 513. In some embodiments, a layer of a micron lens layer is optionally formed over the anti-reflective layer 510.

Figure 2:
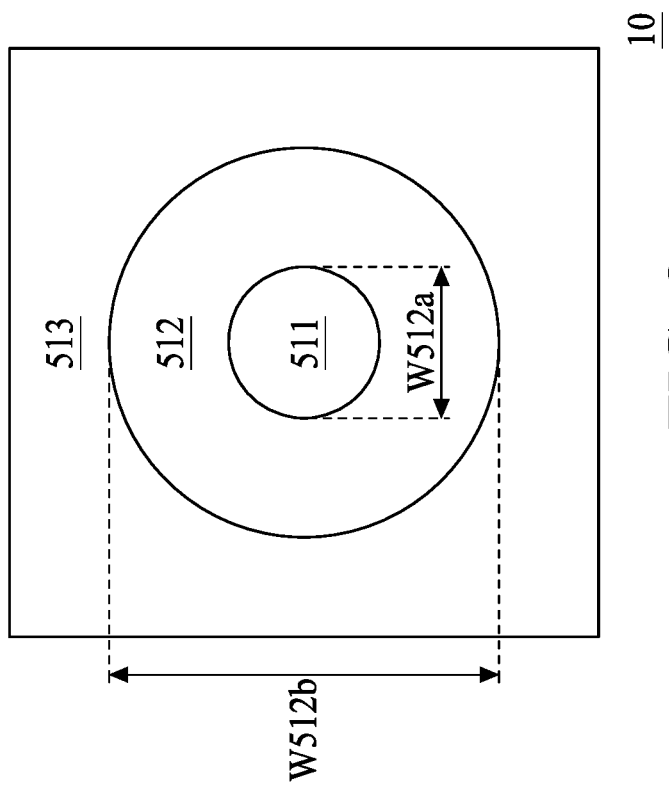
FIG. 2 is a top view of an optical sensor in accordance with some embodiments of the present disclosure.

FIG. 2 shows a top view of the optical sensor 10. In some embodiments, the convex portion 512 of the anti-reflective layer 510 has a configuration of a ring shape from the top view perspective. In some embodiments, an inner diameter W512a of the convex portion 512 is greater than 1 micron. In some embodiments, an outer diameter W512b of the convex portion 512 is greater than 3 microns, and the inner diameter W512a is less than the outer diameter W512b. In some embodiments, the inner diameter W512a of the convex portion 512 is greater than 1 micron and less than 3 microns.

Figure 3:
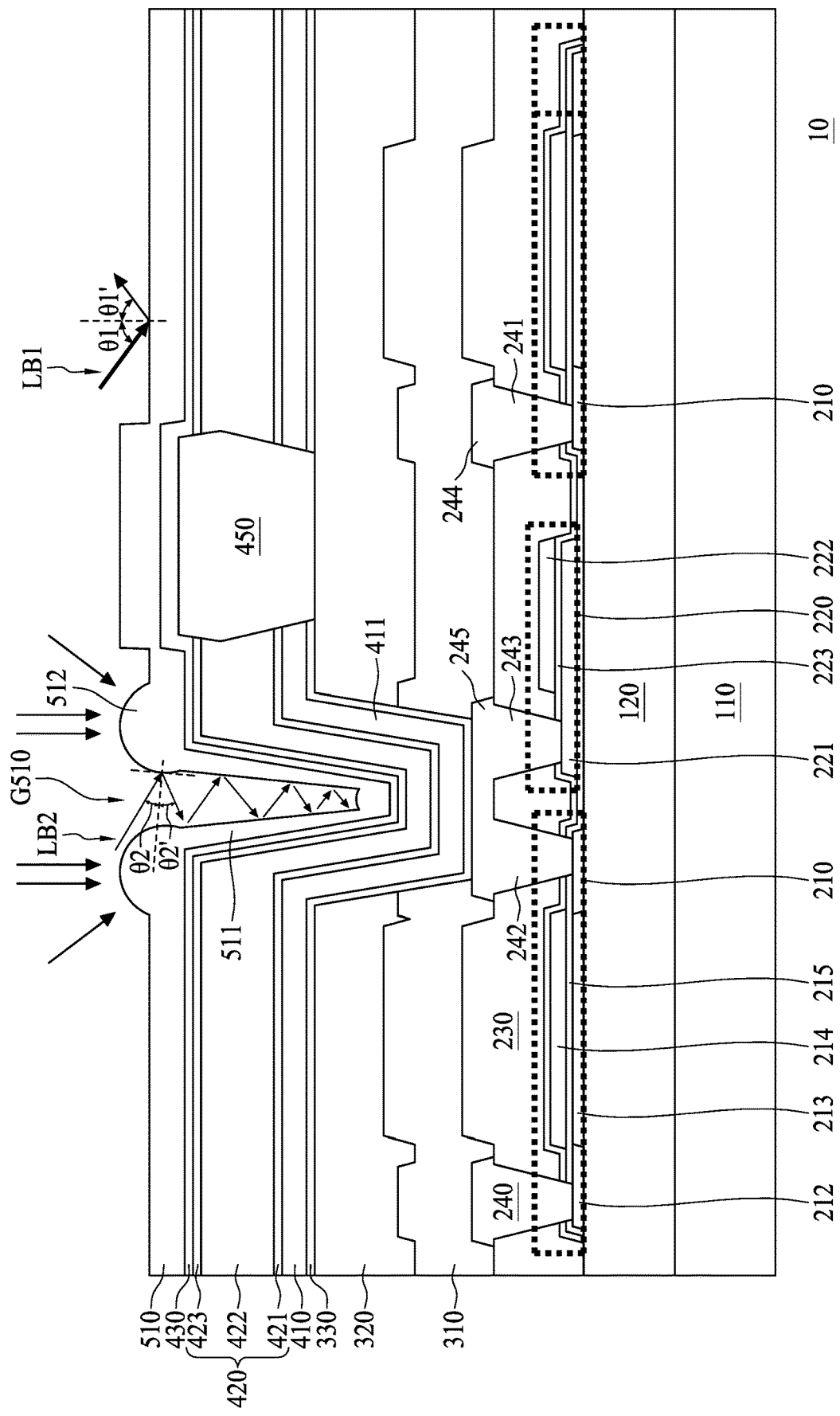
FIG. 3 is a cross-sectional diagram illustrating optical paths of incident light beams into an optical sensor in accordance with some embodiments.

The U-shaped configuration of the photodiode 420 can increase an area of light absorption and thus enhance signal detection of the optical sensor 10. Signals can be enhanced, especially under a low light environment, e.g., when using a finger or a stylus to control a touch panel. Incident light may enter the optical sensor 10 from outside the anti-reflective layer 510. The convex portion 512 of the anti-reflective layer 510 can function as a micro lens to receive incident light from different directions as shown in FIG. 3. The convex portion 512 can increase light absorption, especially absorption of incident light with small angles to the planar surface of the planar portion 513 of the anti-reflective layer 510. For example, an incident light LB1 having an angle θ1 of incidence is incident on the planar portion 513 of the anti-reflective layer 510. In some embodiments, the incident light LB1 may be totally reflected due to a large angle θ1. In some embodiments, a portion of the incident light LB1 may still be reflected as shown in FIG. 2. In practice, it is difficult to completely prevent reflection of the incident light LB1 on the anti-reflective layer 510. An incident light LB2 having a same direction as the incident light LB1 is incident on the convex portion 512 of the anti-reflective layer 510, which is able to receive the incident light LB2 without total reflection due to smaller angle θ2 of the incidence than that of the angle θ1 of the incident light LB1 due in part to the configuration of the convex portion 512. Even if a portion of the incident light LB2 is reflected, due to the configuration of the convex portion 512, the reflected portion of the incident light LB2 is reflected toward the U-shaped portion 511 of the anti-reflective layer 510 and trapped in a groove G510, which is defined by the U-shaped portion 511 and the convex portion 512 of the anti-reflective layer 510. In some embodiments, the U-shaped portion 511 has a tapered configuration with a narrower bottom and a wider top in order to better trap the incident light LB2. The convex portion 512 and the U-shaped portion 511 of the anti-reflective layer 510 can improve absorption of incident light from various directions. In addition, formation of the anti-reflective layer 510 can be integrated with formation of electrical connection between a photodiode and a transistor in a conventional manufacturing process. Thus, formation of the optical sensor 10 can be highly integrated with a manufacturing process of a conventional optical sensor.

Figure 4:
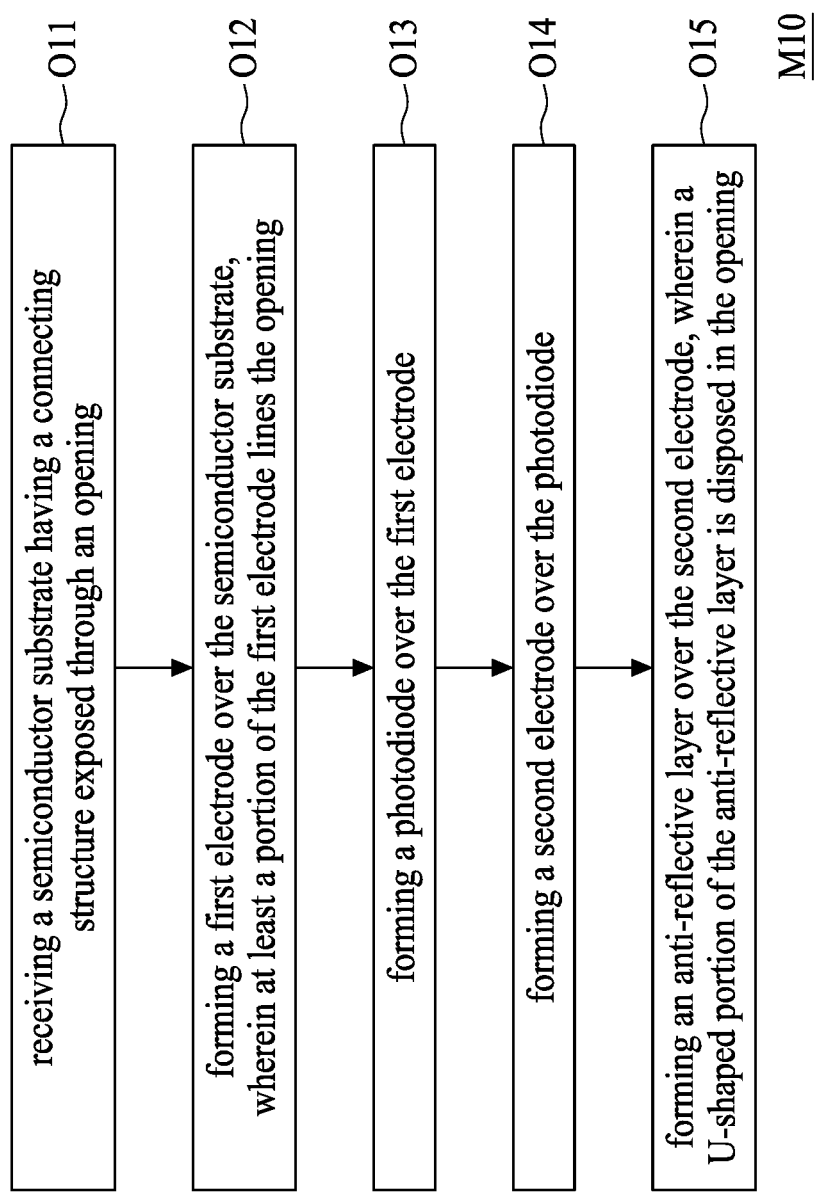
FIG. 4 is a flowchart showing various steps of a method for forming an optical sensor in accordance with some embodiments of the present disclosure.

In order to further illustrate the present disclosure, FIG. 4 is a flowchart of a method M10 for forming an optical sensor in accordance with some embodiments. The method M10 for forming an optical sensor such as the optical sensor 10 or 20 includes following operations: (O11) receiving a semiconductor substrate having a connecting structure exposed through an opening; (O12) forming a first electrode over the semiconductor substrate, wherein at least a portion of the first electrode lines the opening; (O13) forming a photodiode over the first electrode; (O14) forming a second electrode over the photodiode; and (O15) forming an anti-reflective layer over the second electrode, wherein a U-shaped portion of the anti-reflective layer is disposed in the opening. It should be noted that the flowchart shown in FIG. 4 is shown for a purpose of illustration but is not intended to limit the operations to a specific order. A sequence of the operations (O11) to (O15) can be arranged in accordance with different embodiments.

Figure 5:
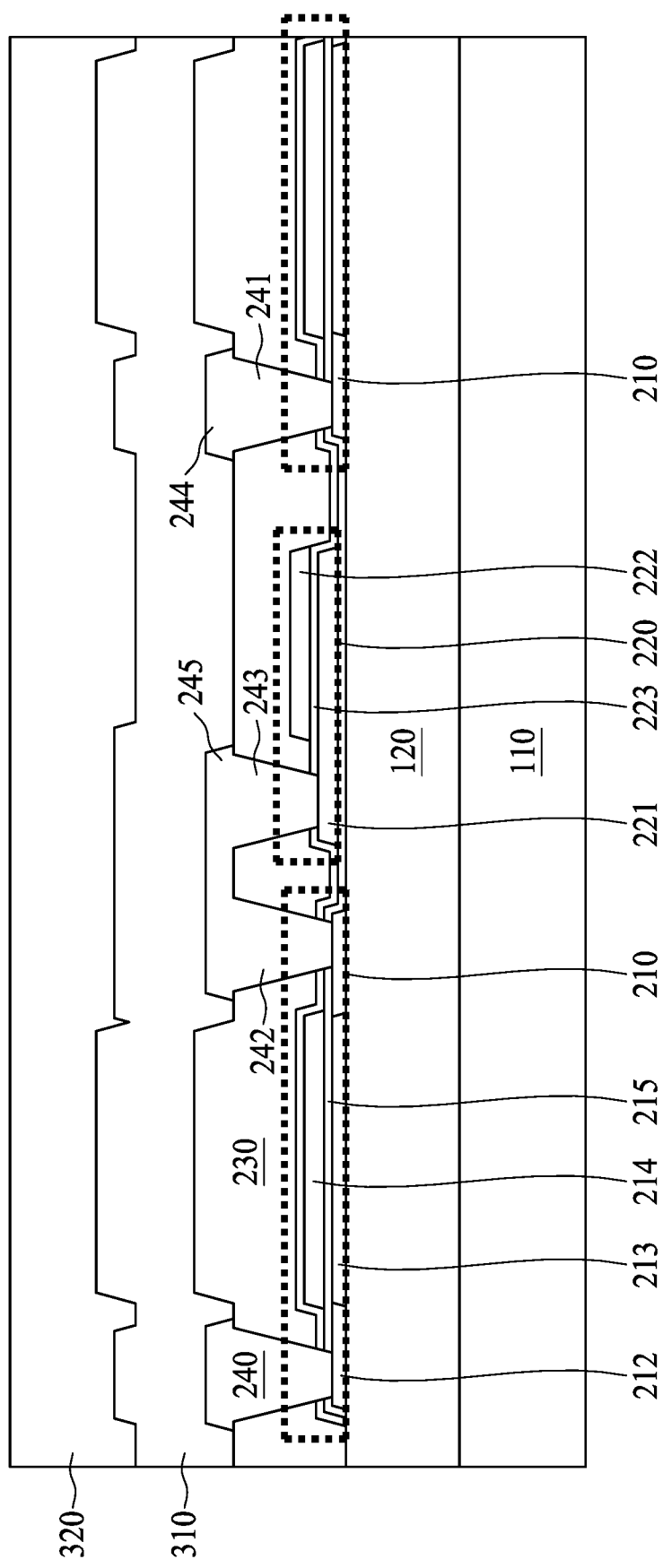
FIGS. 5 to 10 are schematic views of an optical sensor at various stages of manufacture by a method in accordance with some embodiments of the present disclosure.
Figure 6:
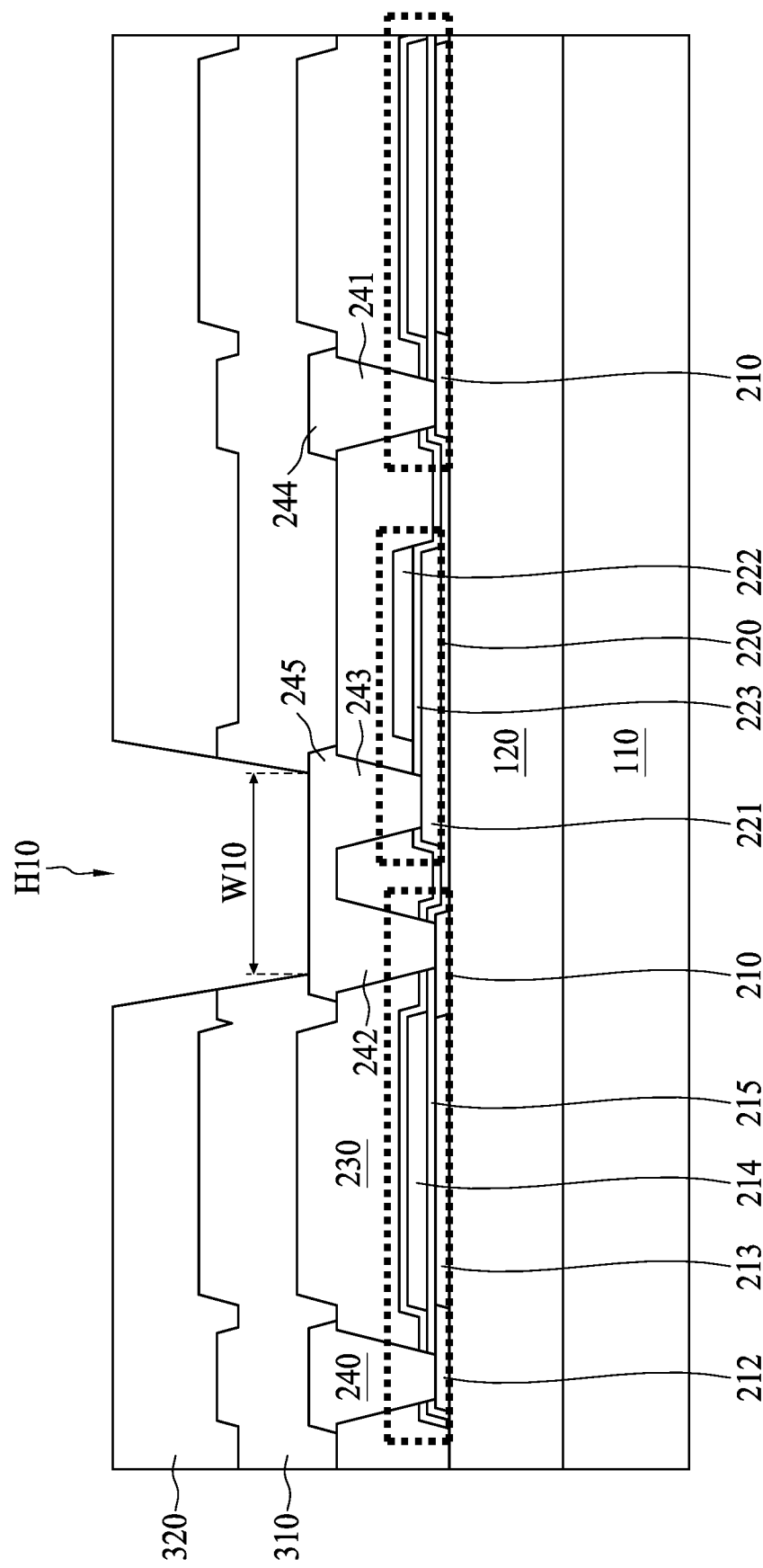

Referring to FIGS. 5 to 6 in accordance with the operation (O11), a semiconductor substrate is received. The semiconductor substrate includes a substrate 110, a dielectric layer 120, several transistors 210, several capacitors 220, an inter-layer dielectric structure 230, several connecting structures 240, a dielectric layer 310 and a planar layer 320, which are similar to those illustrated in relation to the optical sensor 10, and repeated description is omitted herein. A portion of the dielectric layer 310 and a portion of the planar layer 320 directly over a connecting line 245 of the connecting structure 240 are removed to form an opening H10 to expose the connecting line 245. In some embodiments, a diameter W10 of the opening H10 (measured at the bottom of the opening H10 on the connecting line 245) is in a range of 1.8 to 2.2 micrometers. In some embodiments, the opening H10 has a tapered configuration with a narrower bottom and a wider top.

Figure 7:
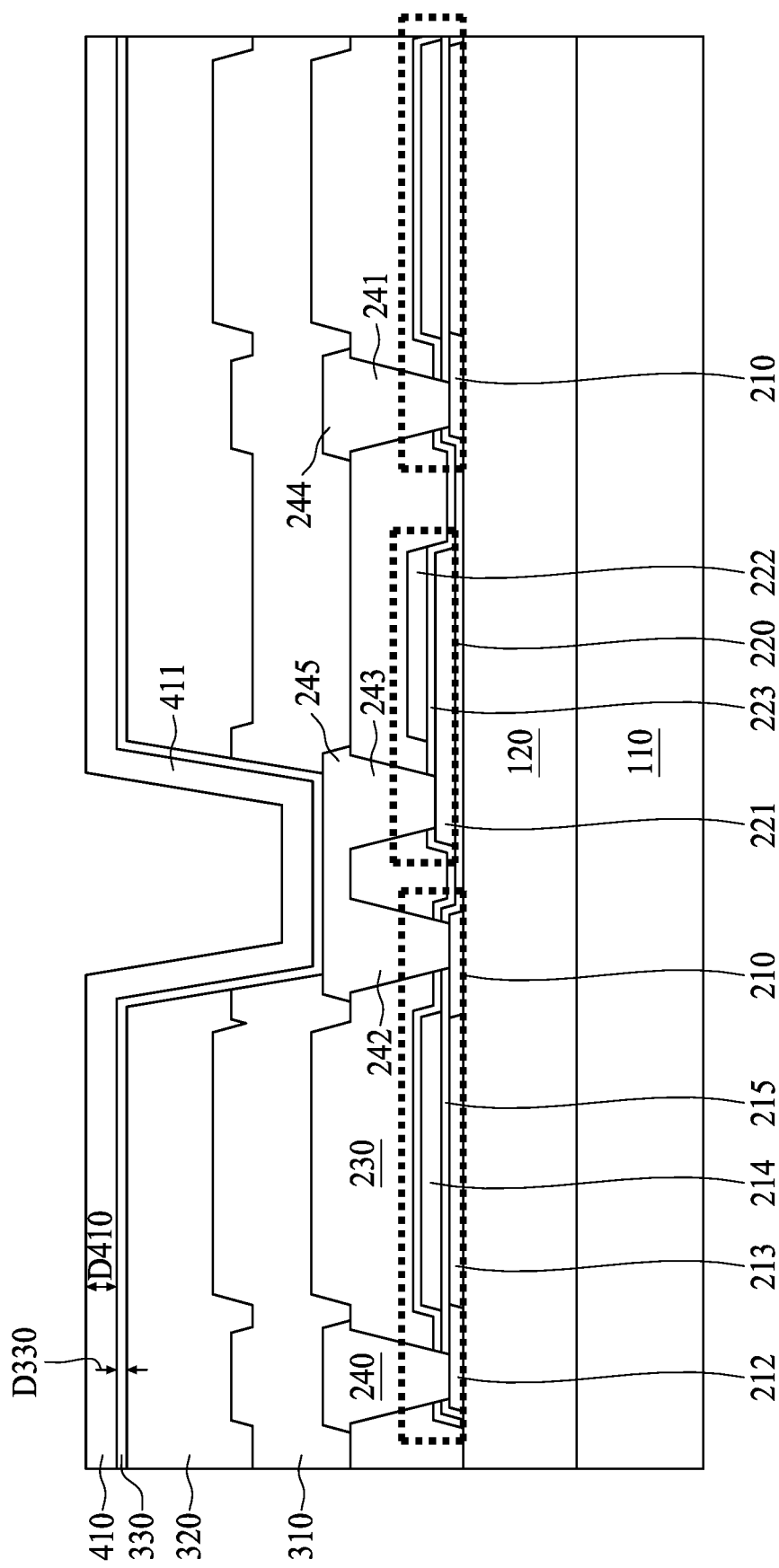

Referring to FIG. 7, in accordance with the operation (O12), a first electrode 410 is formed over the semiconductor substrate and conformal to the opening H10. A U-shaped portion 411 of the first electrode 410 lines the opening H10. In some embodiments, a reflective layer 330 is formed prior to formation of the first electrode 410. At least a portion of the reflective layer 330 lines the opening H10. In some embodiments, the reflective layer 330 and the first electrode 410 are formed by conformal depositions. In some embodiments, a thickness D330 of the reflective layer 330 is in a range of 30 to 200 nanometers. In some embodiments, the first electrode 410 includes indium tin oxide (ITO). In some embodiments, a thickness D410 of the first electrode 410 is in a range of 10 to 100 nanometers. In some embodiments, the thickness D330 of the reflective layer 330 is greater than the thickness D410 of the first electrode 410. In some embodiments, a reflectance of the reflective layer 330 is greater than a reflectance of the first electrode 410, and thus incident light passing through the first electrode 410 can be reflected back toward a photodiode 420 to be formed over the first electrode 410. Therefore, light absorption by the photodiode 420 can be enhanced.

Different thicknesses D330 of the reflective layer 330 correlate to different reflectances of the reflective layer 330 at corresponding wavelengths of light, and different thicknesses D410 of the first electrode 410 correlate to different light absorptances of the first electrode 410 at corresponding wavelengths of light. In some embodiments, the thickness D330 of the reflective layer 330 and the thickness D410 of the first electrode 410 are determined so as to maximize absorptance within a designated range of wavelengths of light. In some embodiments, for high absorptance at green-producing wavelengths, the thickness D410 of the first electrode 410 of an optical sensor 11 is in a range of 10 to 50 nanometers. In some embodiments, for ideal absorptance and high reflectance at green-producing wavelengths, the thickness D330 of the reflective layer 330 of the optical sensor 11 is in a range of 100 to 300 nanometers.

Figure 8:
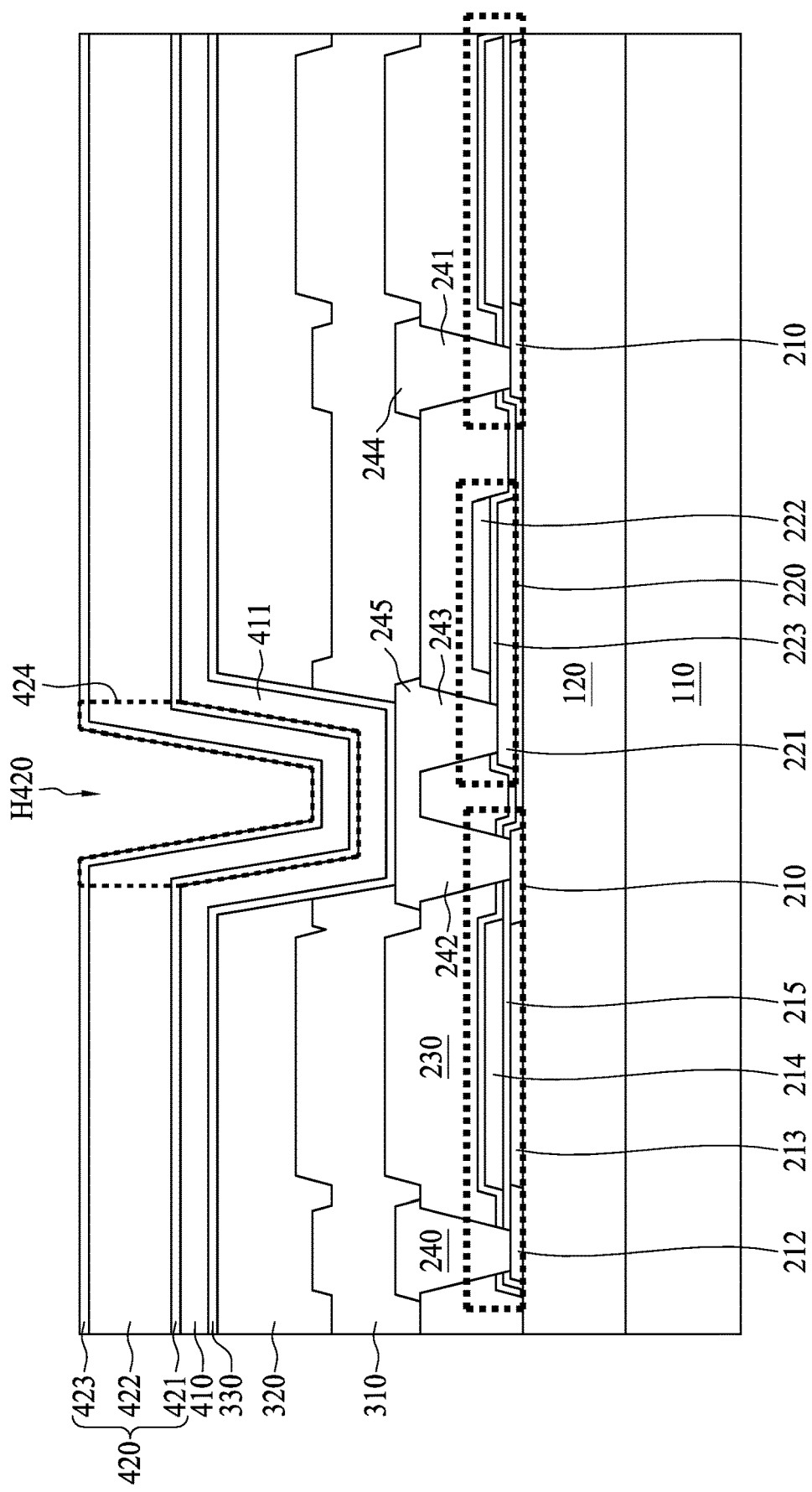

Referring to FIG. 8, in accordance with the operation (O13), the photodiode 420, which includes an N-type doping layer 421, an intrinsic layer 422, and a P-type doping layer 423 stacked in sequence, is formed over and conformal to the first electrode 410. A U-shaped portion 424 of the photodiode 420 lines the opening H10 over the U-shaped portion 411 of the first electrode 410, thereby forming an opening H420 defined by the U-shaped portion 424 of the photodiode 420. The U-shaped portion 424 of the photodiode 420 corresponds to the U-shaped portion 411 of the first electrode 410. In some embodiments, a thickness of the N-type doping layer 421 is in a range of 10 to 100 nanometers. In some embodiments, a thickness of the intrinsic layer 422 is in a range of 250 to 600 nanometers. In some embodiments, a thickness of the P-type doping layer 423 is in a range of 5 to 80 nanometers. In some embodiments, the thickness of the N-type doping layer 421 is greater than the thickness of the P-type doping layer 423. The thicknesses of different layers of the photodiode 420 can be adjusted in order to receive light of different wavelength ranges in accordance with different embodiments.

Figure 9:
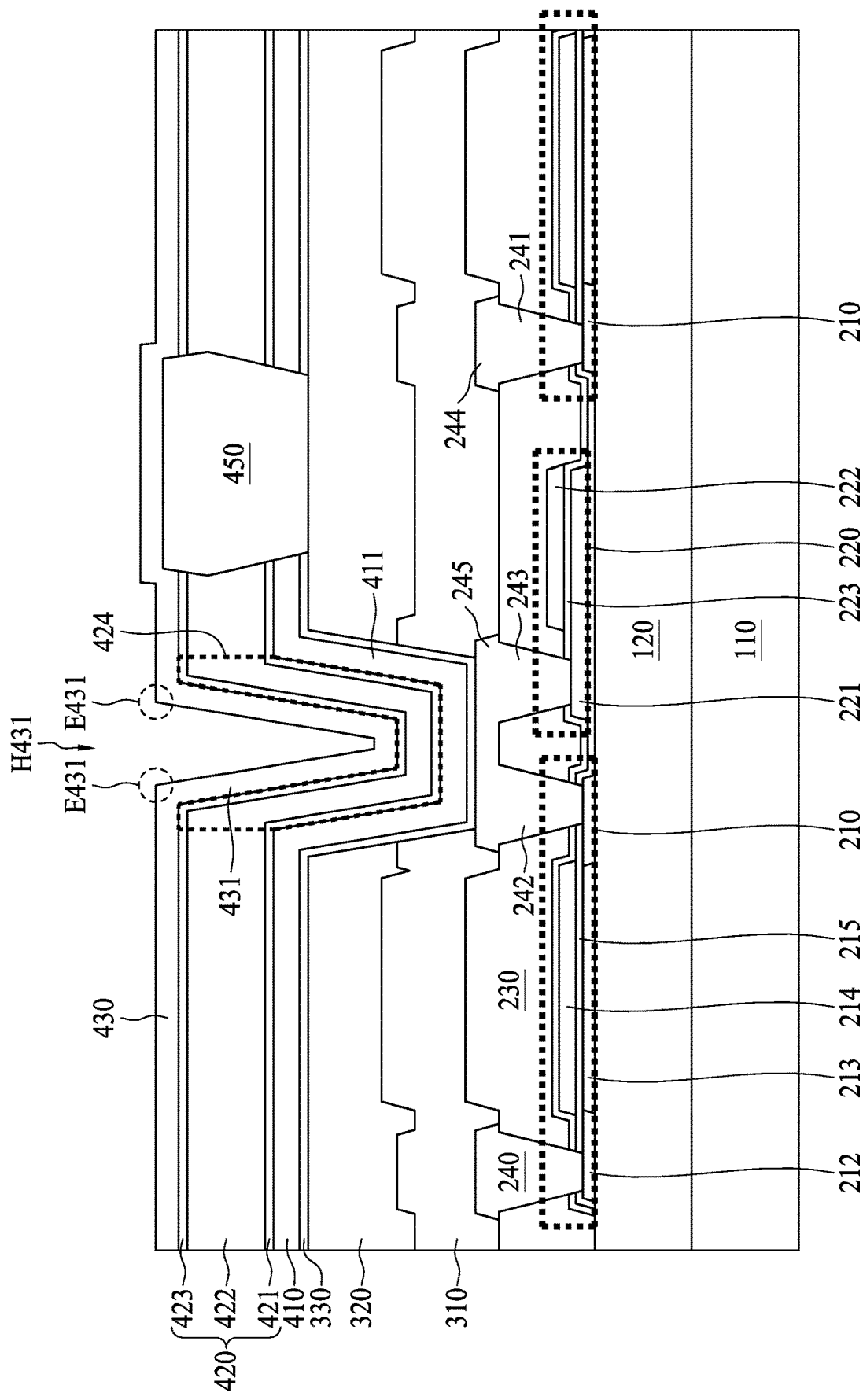

Referring to FIG. 9, in accordance with the operation (O14), a second electrode 430 is formed over the photodiode 420. In some embodiments, a conformal deposition is performed to form the second electrode 430. The second electrode 430 includes a U-shaped portion 431 lining the photodiode 420 and disposed in the opening H420 of the photodiode 420. The U-shaped portion 431 of the second electrode 430 defines an opening H431 collocated with the opening H10. The second electrode 430 also includes a planar portion having a planar surface corresponding to the planar layer 320. In some embodiments, a thickness D430 of the second electrode 430 is in a range of 5 to 180 nanometers.

Similar to the configuration described in relation to FIG. 7 above, the thickness D430 of the second electrode 430 can influence a light absorptance of the optical sensor 11. In some embodiments, for good absorptance at red-producing wavelengths, the thickness D430 of the second electrode 430 of the optical sensor 11 is in a range of 120 to 180 nanometers. In some embodiments, for ideal absorptances at at green-producing wavelengths, the thickness D430 of the second electrode 430 is in a range of 20 to 80 nanometers. In some embodiments, for good absorptance at blue-producing wavelengths, the thickness D430 of the second electrode 430 of the optical sensor 11 is in a range of 5 to 50 nanometers.

In some embodiments, a PDL 450 is formed prior to formation of the second electrode 430. In some embodiments, the PDL 450 is formed during the forming of the photodiode 420.

Figure 10:
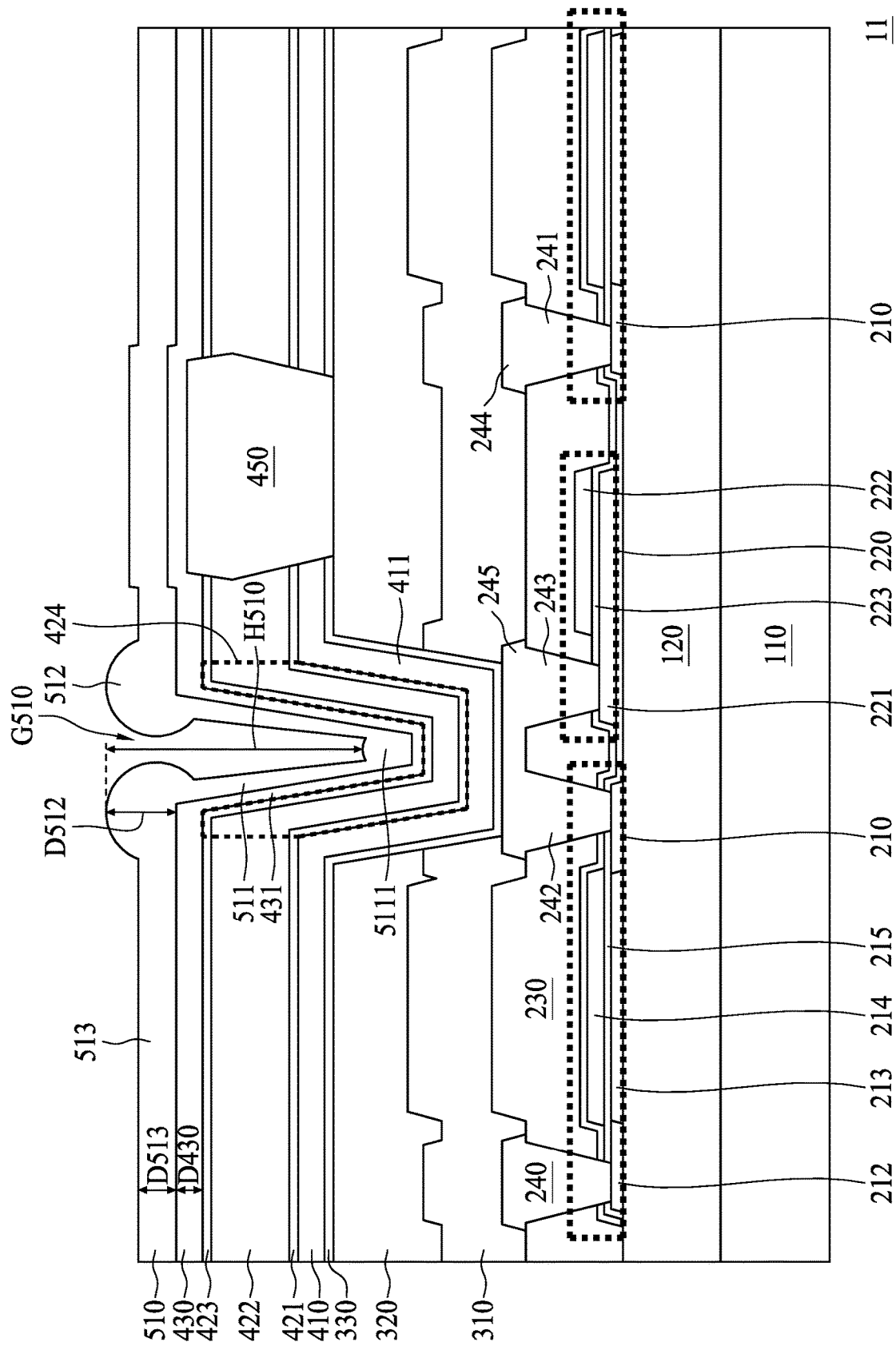

Referring to FIG. 10, in accordance with the operation (O15), an anti-reflective layer 510 is formed over the second electrode 430, and a groove G510 is formed in the opening H431. In some embodiments, a conformal deposition is performed to form the reflective layer 510. In some embodiments, the reflective layer 510 includes a U-shaped portion 511, a convex portion 512 and a planar portion 513. In some embodiments, the groove G510 is defined by the U-shaped portion 511 and the convex portion 512 of the anti-reflective layer 510. In some embodiments, the U-shaped portion 511 includes a convex portion 5111 at an inner bottom of the U-shaped portion 511, protruding away from the second electrode 430 and the photodiode 420. In some embodiments, the convex portion 5111 is formed due to limited space for deposition at the bottom of the opening H431, and also due to properties of the deposition technique by which more material of the anti-reflective layer 510 is deposited at the bottom of the opening H431 than at other locations. The convex portion 512 is formed corresponding to top edges E431 of the opening H431 due to properties of deposition technique. In some embodiments, the edges E431 are corners or transition portions of the U-shaped portion 431 and the planar portion of the second electrode 430. In some embodiments, a thickness D512 of the convex portion 512 is in a range of 250 to 500 nanometers. In some embodiments, a thickness D513 of the planar portion 513 is in a range of 150 to 400 nanometers. In some embodiments, a height H510 is in a range of 2 to 5 nm. In some embodiments, an aspect ratio (the inner diameter W512a to the height H510) of the groove G510 is in a range of 0.1 to 2. In some embodiments, the aspect ratio of the groove G510 is in a range of 0.1 to 1.3 in order to have better detection of the incident lights that light signal lost at each reflection in the groove G510 can be reduced. An optical sensor 11 is formed as shown in FIG. 10.

The convex portion 512 and the planar portion 513 of the anti-reflective layer 510 may be designed to have good light absorptances at various ranges of wavelengths. In some embodiments, the thickness D512 of the convex portion 512 is in a range of 300 to 380 nanometers for good absorptance at green-producing wavelengths, while the thickness D513 of the planar portion 513 is in a range of 250 to 300 nanometers for good absorptance at red-producing wavelengths.

Figure 11:
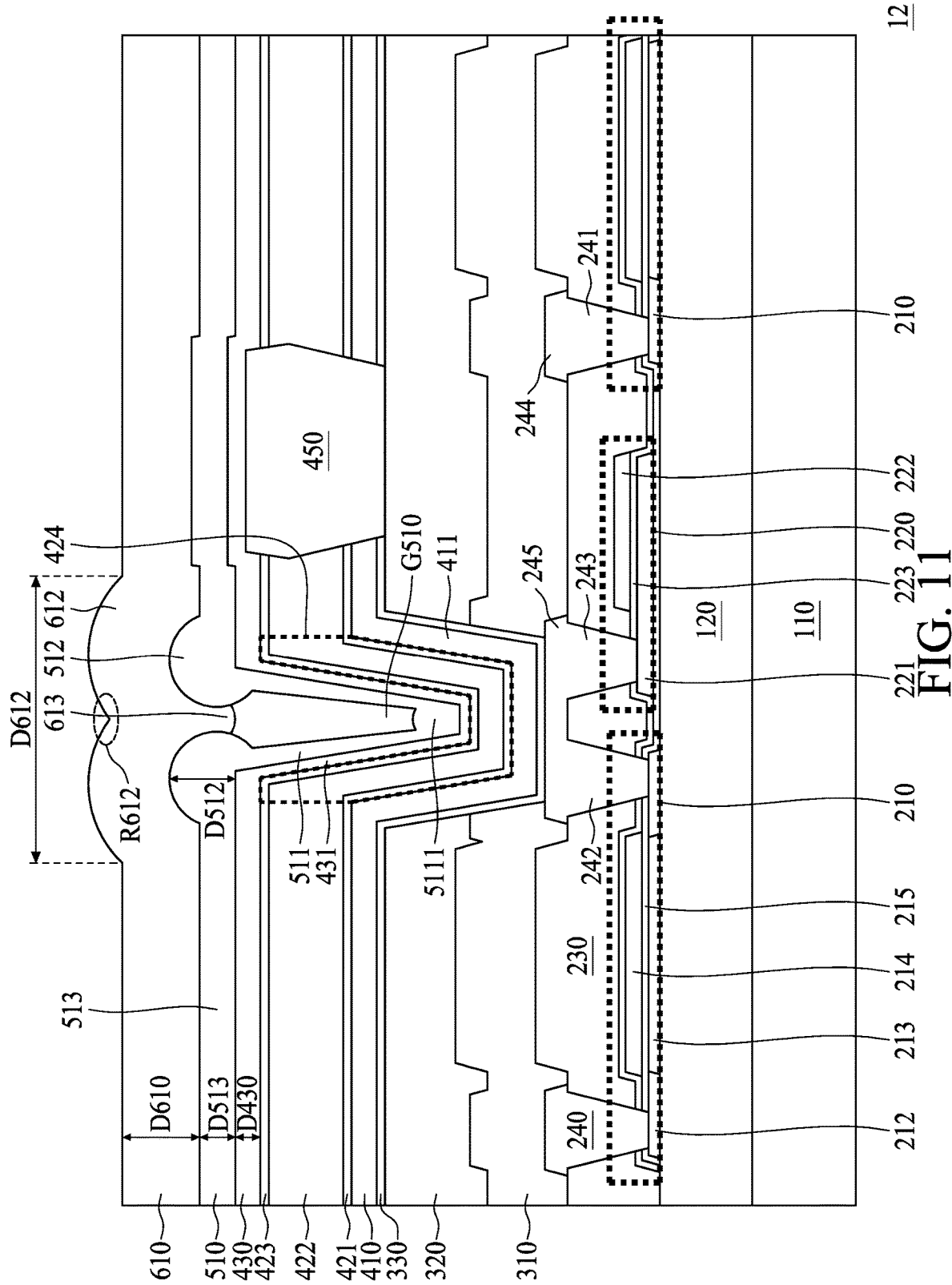
FIG. 11 is a cross-sectional diagram of an optical sensor in accordance with some embodiments of the present disclosure.
Figure 12:
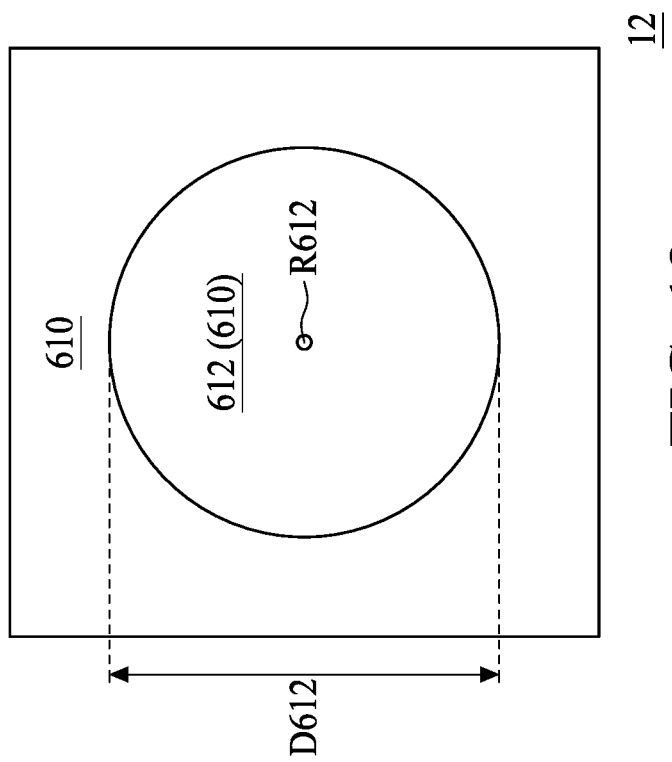
FIG. 12 is a top view of an optical sensor in accordance with some embodiments of the present disclosure.

In some embodiments, the method M10 further includes an operation of forming a micro lens layer over the anti-reflective layer. FIGS. 11 to 12 are cross-sectional diagrams of an optical sensor 12 and 13 respectively in accordance with different embodiments of the present disclosure.

Referring to FIG. 11, an optical sensor 12 includes a micro lens layer 610 formed over the anti-reflective layer 510. In some embodiments, micro lens layer 610 is formed on an intermediate structure similar to the structure as shown in FIG. 10, and repeat illustration is omitted herein. In some embodiments, the micro lens layer 610 is formed by a spin coating process. In some embodiments, a reflow operation is omitted in the formation of the micro lens layer 610 due to presence of the convex portion 512 of the anti-reflective layer 510. In some embodiments, the micro lens layer 610 is light transparent. In some embodiments, the micro lens layer includes an acryl resin (such as polymethyl methacrylate, polyhydroxyethyl methacrylate and polycyclohexyl methacrylate), an acryl resin (such as polydiethyleneglycolbisaryl carbonate, and polycarbonate), a methacylate resin, a polyurethane resin, a polyester resin, a polyvinylchloride resin, a polyvinylacetate resin, a cellulose resin, a polyamide resin, a fluororesin, a polypropylene resin, a polystyrene resin, other suitable thermoplastic or heat curing resins, and a combination thereof. In some embodiments, a thickness D610 of the micro lens layer 610 is in a range of 5 to 100 microns.

In some embodiments as shown in FIG. 11, the micro lens layer 610 includes a protruding portion 612 at a position corresponding to the convex portion 512 of the anti-reflective layer 510 and a recessed portion R612 at a position corresponding to the groove G510. In some embodiments, the protruding portion 612 is a ring, and a top view of the optical sensor 12 is shown in FIG. 12. A diameter D612 of the protruding portion 612 is according to the thickness D610 and an outer diameter W512b of the convex portion 512. In some embodiments, the diameter D612 is in a range of 3500 nm to 6000 nm. In some embodiments, the micro lens layer 610 is partially inside the groove G510. In some embodiments, the micro lens layer 610 includes a protruding portion 613 in-between the convex portion 512 and inside the groove G510 thereby defining a gap G510'. In some embodiments, the protruding portion 613 faces away from the protruding portion 612 and toward the gap G510'. In some embodiments, the circular or ring shaped protruding portion 612 functions to receive incident light from different directions, similar to the convex portion 512 of the optical sensor 10 or 11 shown in FIG. 3 or FIG. 10 respectively. In some embodiments, the gap G510' has a reflective index smaller than those of the micro lens layer 610 and the anti-reflective layer 510. In some embodiments, presence of the gap G510' functions to concentrate the incident lights passing through the gap G510'.

Figure 13:
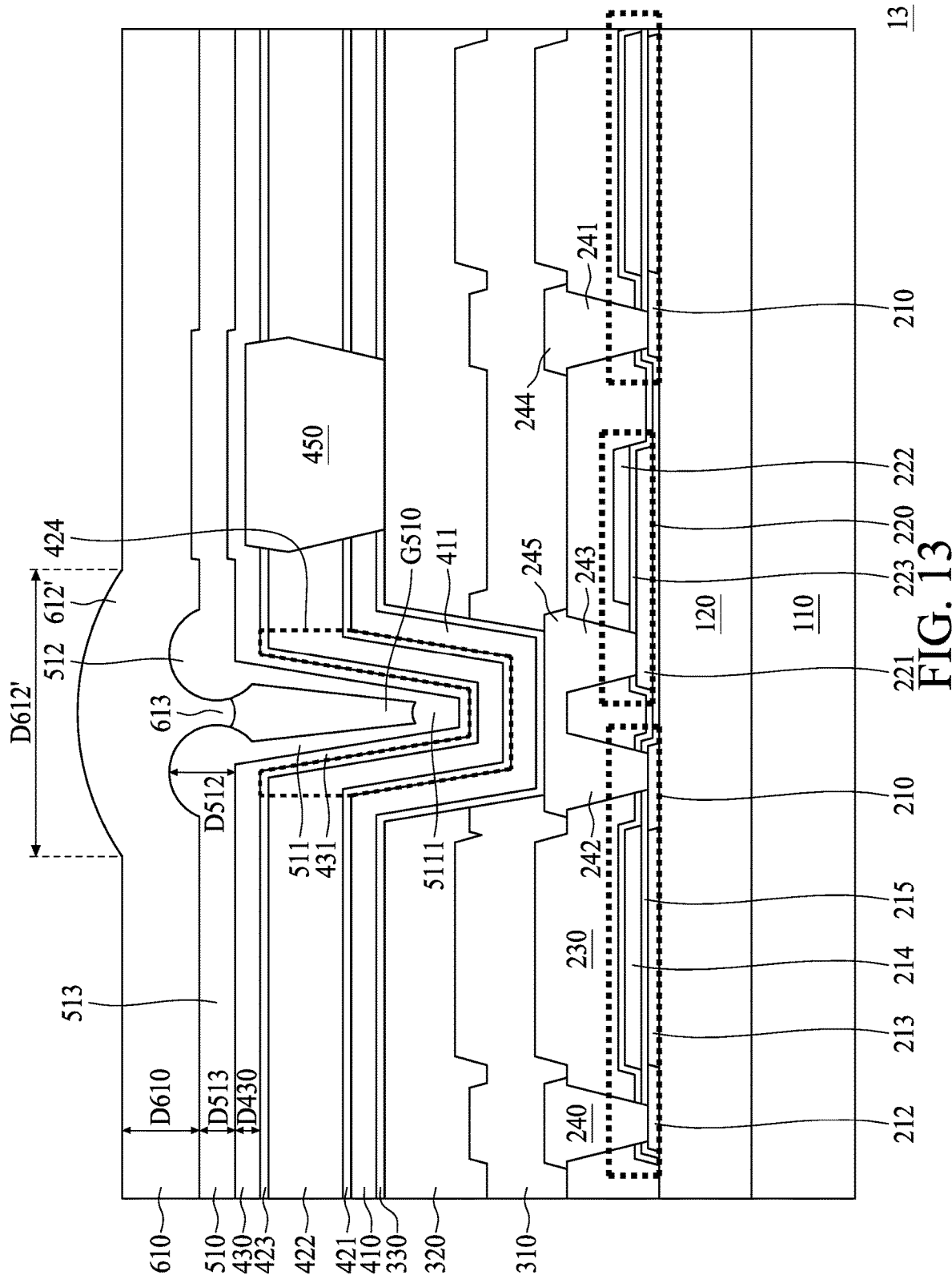
FIG. 13 is a cross-sectional diagram of an optical sensor in accordance with some embodiments of the present disclosure.
Figure 14:
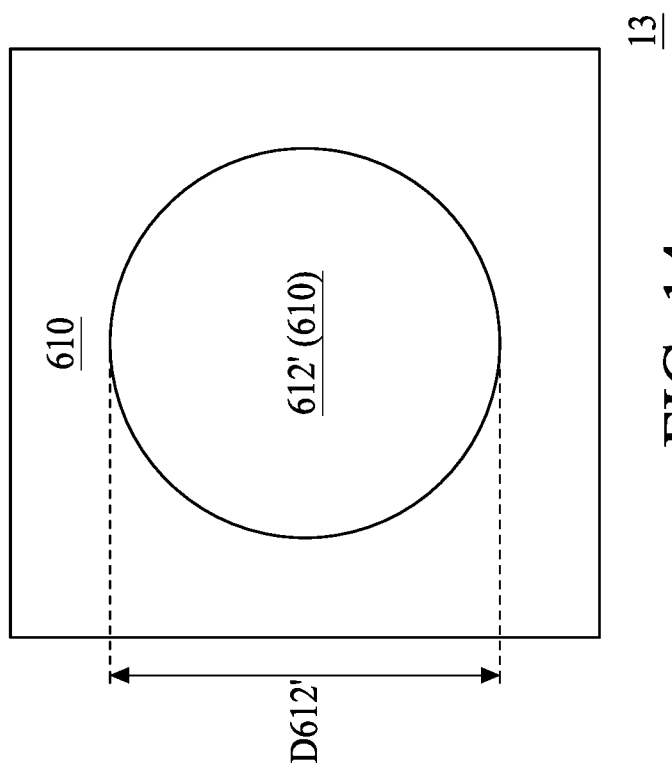
FIG. 14 is a top view of an optical sensor in accordance with some embodiments of the present disclosure.

Referring to FIG. 13 in accordance with different embodiments, an optical sensor 13 includes a micro lens layer 610 formed over the anti-reflective layer 510, wherein the micro lens layer 610 having a protruding portion 612' without a recessed portion. In some embodiments, formation and materials of the micro lens layer 610 are similar to the micro lens layer 610 of the optical sensor 12, and repeat illustration is omitted herein. In some embodiments, the protruding portion 612' with no recessed portion is formed due to a small inner diameter W512b of the groove G510 and fast coating rate of the micro lens layer 610. In some embodiments, the protruding portion 612 covers to the convex portion 512 and the groove G510. In some embodiments, the protruding portion 612 is circular, and a top view of the optical sensor 13 is shown in FIG. 14. Similar to the optical sensor 12, a diameter D612' of the protruding portion 612' is according to the thickness D610 and an outer diameter W512b of the convex portion 512. In some embodiments, the diameter D612' is in a range of 3500 to 6000 nm. In some embodiments, the micro lens layer 610 is partially inside the groove G510, similar to the micro lens layer 610 of the optical sensor 12. In some embodiments, a gap G510' is defined by a protruding portion 613 of the micro lens layer 610 and an U-shaped portion 511 of the anti-reflective layer 510. In some embodiments having a same diameter D612' as the diameter D612, the optical sensor 12 may have higher intensity of incident light received due to the double protrusions of the protruding portion 612' from the cross-sectional perspective shown in FIG. 11 instead of a single protrusion of the protruding portion 612 from the cross-sectional perspective shown in FIG. 14. In some embodiments, the optical sensor 12 may be able to receive more incident lights from different directions than the optical sensor 13.

Therefore, from an aspect of the present disclosure, an optical sensor is provided. The optical sensor includes a substrate, a transistor, a first electrode, a photodiode, a second electrode and an anti-reflective layer. The transistor is disposed over the substrate. The first electrode is disposed over the substrate and electrically connected to the transistor. The second electrode is disposed over the first electrode, and the photodiode is disposed between the first electrode and the second electrode. The anti-reflective layer is disposed over the second electrode and a first U-shaped portion lining the second electrode.

From another aspect of the present disclosure, a method for forming an optical sensor is provided. The method includes following operations: (O11) receiving a semiconductor substrate having a connecting structure exposed through an opening; (O12) forming a first electrode over the semiconductor substrate, wherein at least a portion of the first electrode lines the opening; (O13) forming a photodiode over the first electrode; (O14) forming a second electrode over the photodiode; and (O15) forming an anti-reflective layer over the second electrode, wherein a U-shaped portion of the anti-reflective layer is disposed in the opening.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical sensor, comprising:
    a substrate;
    a transistor, disposed over the substrate;
    a first electrode, disposed over the substrate and electrically connected to the transistor;
    a second electrode, disposed over the first electrode;
    a photodiode, disposed between the first electrode and the second electrode; and
    an anti-reflective layer, disposed over the second electrode, comprising a first U-shaped portion lining the second electrode.

2. The optical sensor of claim 1, wherein the first U-shaped portion of the anti-reflective layer is conformal to a second U-shaped portion of the second electrode.

3. The optical sensor of claim 2, wherein the photodiode comprises a third U-shaped portion disposed between the second U-shaped portion of the second electrode and a fourth U-shaped portion of the first electrode.

4. The optical sensor of claim 1, wherein the anti-reflective layer further comprises:
 a planar portion, extending along an extending direction of the substrate; and
 a convex portion, connecting the planar portion and the first U-shaped portion, wherein a thickness of the convex portion is greater than a thickness of the planar portion.

5. The optical sensor of claim 4, wherein the convex portion has a configuration of a ring shape from a top view perspective.

6. The optical sensor of claim 5, wherein an outer diameter of the convex portion is greater than 3 microns.

7. The optical sensor of claim 5, wherein an inner diameter of the convex portion is greater than 1 micron and less than 3 microns.

8. The optical sensor of claim 4, wherein the thickness of the convex portion is in a range of 250 to 450 nanometers.

9. The optical sensor of claim 4, wherein the thickness of the planar portion is in a range of 200 to 350 nanometers.

10. The optical sensor of claim 4, wherein the thickness of the convex portion is in a range of 300 to 350 nanometers, and a thickness of the second electrode is in a range of 20 to 80 nanometers.

11. The optical sensor of claim 1, wherein the anti-reflective layer further comprises:
 a second convex portion, disposed at a bottom of the first U-shaped portion and protruding away from the photodiode.

12. The optical sensor of claim 1, further comprising:
 a dielectric layer, disposed between the transistor and the first electrode, comprising a through hole.

13. The optical sensor of claim 12, wherein the first electrode lines the through hole thereby penetrating the dielectric layer to electrically connect to the transistor.

14. The optical sensor of claim 12, further comprising:
 a reflective layer, disposed between the dielectric layer and the first electrode, and lining the through hole.

15. The optical sensor of claim 14, wherein a thickness of the reflective layer is in a range of 130 to 180 nanometers, and a thickness of the first electrode is in a range of 10 to 50 nanometers.

16. The optical sensor of claim 1, further comprising:
 a connecting line, disposed between the transistor and the first electrode, wherein a bottom of a U-shaped portion of the first electrode is disposed within a top surface of the connecting line.

17. The optical sensor of claim 1, further comprising:
 a capacitor, disposed over the substrate, and electrically connected to the transistor.

18. The optical sensor of claim 17, wherein the capacitor, the photodiode and the transistor are electrically connected through one connecting line.

* * * * *